(12) United States Patent
Koo et al.

(10) Patent No.: US 7,307,299 B2
(45) Date of Patent: Dec. 11, 2007

(54) SPIN TRANSISTOR USING SPIN-ORBIT COUPLING INDUCED MAGNETIC FIELD

(75) Inventors: Hyun Cheol Koo, Seoul (KR); Suk Hee Han, Seoul (KR); Jong Hwa Eom, Seoul (KR); Joon Yeon Chang, Seoul (KR); Hyun Jung Yi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 68 days.

(21) Appl. No.: 11/305,500

(22) Filed: Dec. 15, 2005

(65) Prior Publication Data

US 2007/0059877 A1 Mar. 15, 2007

(30) Foreign Application Priority Data

Sep. 14, 2005 (KR) .................. 10-2005-0085717

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................................. 257/288
(58) Field of Classification Search ............... 257/288, 257/200, 201, 213, 295, 296, 310, 350, 401, 257/421
See application file for complete search history.

(56) References Cited

U.S. PATENT DOCUMENTS

| | | | | |
|---|---|---|---|---|
| 5,432,373 A | * | 7/1995 | Johnson | ................ 257/421 |
| 5,565,695 A | * | 10/1996 | Johnson | ................ 257/295 |
| 5,652,445 A | * | 7/1997 | Johnson | ................ 257/295 |
| 5,654,566 A | * | 8/1997 | Johnson | ................ 257/295 |
| 6,753,562 B1 | * | 6/2004 | Hsu et al. | ................ 257/295 |

OTHER PUBLICATIONS

Supriyo Data and Biswajit Das, "Electronic Analog Of The Electro-Optic Modulator," (School of Electrical Engineering, Purdue University, West Lafayette, Indiana 47907), Appl. Phys. Lett., vol. 56, No. 7, Feb. 12, 1990, pp. 665-667, © 1990 American Institute of Physics, USA.

* cited by examiner

*Primary Examiner*—David Nhu
(74) *Attorney, Agent, or Firm*—Perkins Coie LLP

(57) ABSTRACT

A spin transistor having wide ON/OFF operation margin and producing less noise is provided. The spin transistor includes a substrate having a channel, a source, a drain and a gate formed on the substrate. The source and the drain are formed to have magnetization directions perpendicular to the length direction of the channel. The ON/OFF operations of the spin transistor can be controlled by generating a spin-orbit coupling induced magnetic field to have a direction parallel or anti-parallel to the magnetization directions of the source and the drain.

17 Claims, 9 Drawing Sheets

SPIN TRANSISTOR USING SPIN-ORBIT COUPLING INDUCED MAGNETIC FIELD

RELATED APPLICATION

The present application is based on, and claims priority from, Korean Application Number 2005-85717, filed Sep. 14, 2005, the disclosure of which is hereby incorporated by reference herein in its entirety.

BACKGROUND OF THE INVENTION

1. Field of the Invention

The present invention relates to a spin transistor using a spin-orbit coupling induced magnetic field, and more particularly, to a spin transistor having a wide ON/OFF operation margin and making less noise that is generated by leakage magnetic field.

2. Description of the Related Art

A metal oxide silicon field effect transistor (MOSFET) is one of representative elements in a modern integrated circuit technology. The MOSFET is generally included as an essential element for performing ON/OFF switching operation in a memory device such as a flash memory and a DRAM, as well as a logic circuit, ASIC and a microprocessor. Recently, a spin transistor (Spin-FET) is introduced. A conventional semiconductor based transistor controls only electric charge formed in the semiconductor using electric field. On the contrary, the spin transistor simultaneously controls electric charge and its spin. The spin transistor can be used in a switching element and a logic circuit by control of spin-polarized charge.

Though the MOSFET is currently used as an essential element in a semiconductor field, it has several drawbacks. For example, it is difficult to further reduce power consumption and volume of the MOSFET. In addition, the gate oxide of the MOSFET faces physical limitations. In order to overcome such limitations of the MOSFET, transistors that control spin-precession of electric charge with the voltage are introduced. Among them, a spin transistor includes a source, a drain and a channel connecting the source and the drain. A quantum well layer may be used as the channel in the spin transistor.

In a conventional spin transistor, magnetization directions of a source and a drain are identical to a channel direction, that is, a traveling direction of an electron (refer to Datta-Das spin FET in Applied physics letter, vol. 56, 665, 1990, and U.S. Pat. No. 5,654,566 issued to Mark B. Johnson entitled "MAGNETIC SPIN INJECTED FIELD EFFECT TRANSISTOR AND METHOD OF OPERATION"). In the conventional spin transistor, spin information of the electron is likely to be lost by stray field generated at the ends of the source and the drain. The generated stray field shortens an effective distance of spin transfer and makes considerable noise.

The conventional spin transistor controls a spin direction of an electron reached at the drain to be parallel or anti-parallel to the magnetization direction of the drain by controlling a "spin-precession" of an electron. By control of the spin-precession of the electron, the resistance of the channel is adjusted. However, it is very difficult to precisely adjust an angle of the precession and to accurately form the channel to have a proper length corresponding to the precession angle. Therefore, the conventional spin transistor has a narrow ON/OFF operation margin and allows a narrow process margin for the channel length. As a result, operating accuracy degrades and a manufacturing process thereof becomes complicated.

SUMMARY OF THE INVENTION

Accordingly, the present invention is directed to a spin transistor using spin-orbit coupling induced magnetic field that substantially obviates one or more problems due to limitations and disadvantages of the related art.

An object of the present invention is to provide a spin transistor having wide ON/OFF operation margin, allowing a broad process margin for channel length and producing less noise.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a spin transistor includes: a substrate having a channel; a source and a drain, which are made of ferromagnetic material, formed on the substrate to be separated from one another and having identical magnetization directions; a gate formed on the substrate for controlling a spin direction of an electron passing through the channel, wherein the magnetization directions of the source and the drain are perpendicular to a length direction of the channel.

The channel may be formed as a quantum well layer. Since the quantum well layer has two-dimensional electron gas (2-DEG), mobility of electron is very fast in the well layer and greater spin-orbit coupling effect is occurred. The quantum well layer may be formed of one selected from the group consisting of GaAs, InAs and InGaAs.

At least one of the source and the drain may be made of a ferromagnetic metal, and the ferromagnetic metal may be one selected from the group consisting of Fe, Co, Ni, CoFe, NiFe, and combination thereof.

At least one of the source and the drain may be made of a ferromagnetic semiconductor and the ferromagnetic semiconductor may be (Ga, Mn)As.

The substrate may include an InAs quantum well layer interposed between an undoped upper clad layer and an undoped lower clad layer. In this case, each of the upper and lower clad layers may have a double layer structure formed of an InGaAs layer and an InAlAs layer. Also, the substrate may further include an InAlAs carrier supply layer formed under the lower clad layer. The substrate may further include an InAs capping layer formed on the upper clad layer.

The substrate may have a ridge structure with both sides being removed and the channel may be defined by the ridge structure. An insulating layer may be formed on the both side of the ridge structure for planarization, and the insulating layer may be formed of $SiO_2$ or $TaO_2$.

According to one embodiment, in order to control ON/OFF operation of the spin transistor, a spin direction of an electron may be controlled to be parallel or anti-parallel to a magnetization direction of a source and a drain through controlling a polarity of the gate voltage. The spin transistor may be turned on when the direction of the spin-orbit coupling induced magnetic field is identical to the spin direction of the electron injected from the source; and the spin transistor may be turned off when the direction of the spin-orbit coupling induced magnetic field is opposite to the spin direction of the electron injected from the source.

According to another embodiment, the gate voltage may be removed during OFF-state so that the electron has a random spin direction, and the gate voltage may be applied during ON-state so that the electron has a spin direction to maintain spin information of the electron injected from the source.

According to the present invention, the source and the drain are formed to have magnetization directions to be perpendicular to a channel length, that is, a direction of channel current. Accordingly, spin-orbit coupling induced magnetic field is generated to have a direction identical or opposite to the magnetization directions of the source and the drain when a gate voltage is applied. Therefore, a precession is not arisen and wide ON/OFF operation margin is provided.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
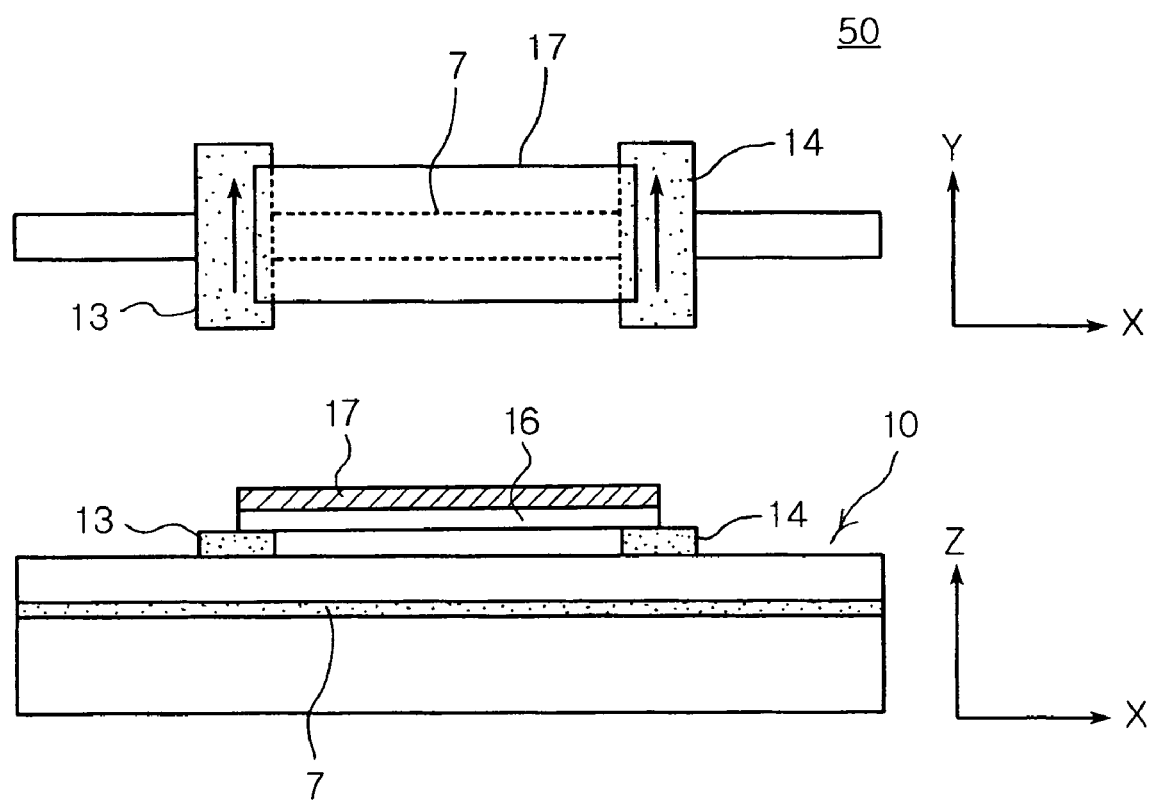
FIG. 1 is a schematic top view and a schematic cross-sectional view of a spin transistor according to an embodiment of the present invention.

FIG. 1 is a schematic plan view and a schematic cross-sectional view of a spin transistor according to an embodiment of the present invention.

Referring to FIG. 1, the spin transistor 50 includes: a substrate 10, a source 13, a drain 14 and a gate 17. The substrate 10 has a quantum well layer 7 as a channel. The source 13, the drain 14 and the gate 17 controlling an ON/OFF operation are formed on the substrate 10. The gate 17 is insulated from the source 13 and the drain 14 by a gate insulating layer 16. The quantum well layer 7 forms a channel of the spin transistor 50. The source 13 and the drain 14 are made of a magnetized ferromagnetic material and have an identical magnetization direction. For example, the source 13 and the drain 14 may be made of ferromagnetic metal such as Fe, Co, Ni, CoFe or NiFe, or ferromagnetic semiconductor such as (Ga, Mn)As.

As shown in FIG. 1, the magnetization direction Y of the source 13 and the drain 14 is perpendicular to the length direction X of the channel that denotes a traveling direction of electron in the channel in the spin transistor 50. Since the magnetization direction Y is perpendicular to the length direction X, a spin-orbit coupling induced magnetic field $H_{eff}$ has an identical direction (parallel) or an opposite direction (anti-parallel) to the magnetization direction Y. That is, when a gate voltage is applied, the spin-orbit coupling induced magnetic field $H_{eff}$ is generated with a parallel direction or an anti-parallel direction to the magnetization direction Y of the source 13 and the drain 14. Therefore, spin-precession of electrons is not occurred in the spin transistor 50.

If the $H_{eff}$ is generated with an identical direction (parallel direction) to the magnetization direction of the source 13 and the drain 14 when the gate voltage is applied, a spin direction of an electron is parallel to the magnetization direction of the drain 14 when the electron reaches the drain 14. Accordingly, a low resistance is formed between the source 13 and the drain 14 and the spin transistor 50 is in ON-state. On the contrary, if the $H_{eff}$ is generated with the opposite direction (anti-parallel direction) to the magnetization direction of the drain 14, the spin direction of the electron is anti-parallel to the magnetization direction of the source 13 and the drain 14 when the electron reaches the drain 14. Therefore, high resistance is formed between the source 13 and the drain 14, and the spin transistor is in OFF-state.

Figure 2:
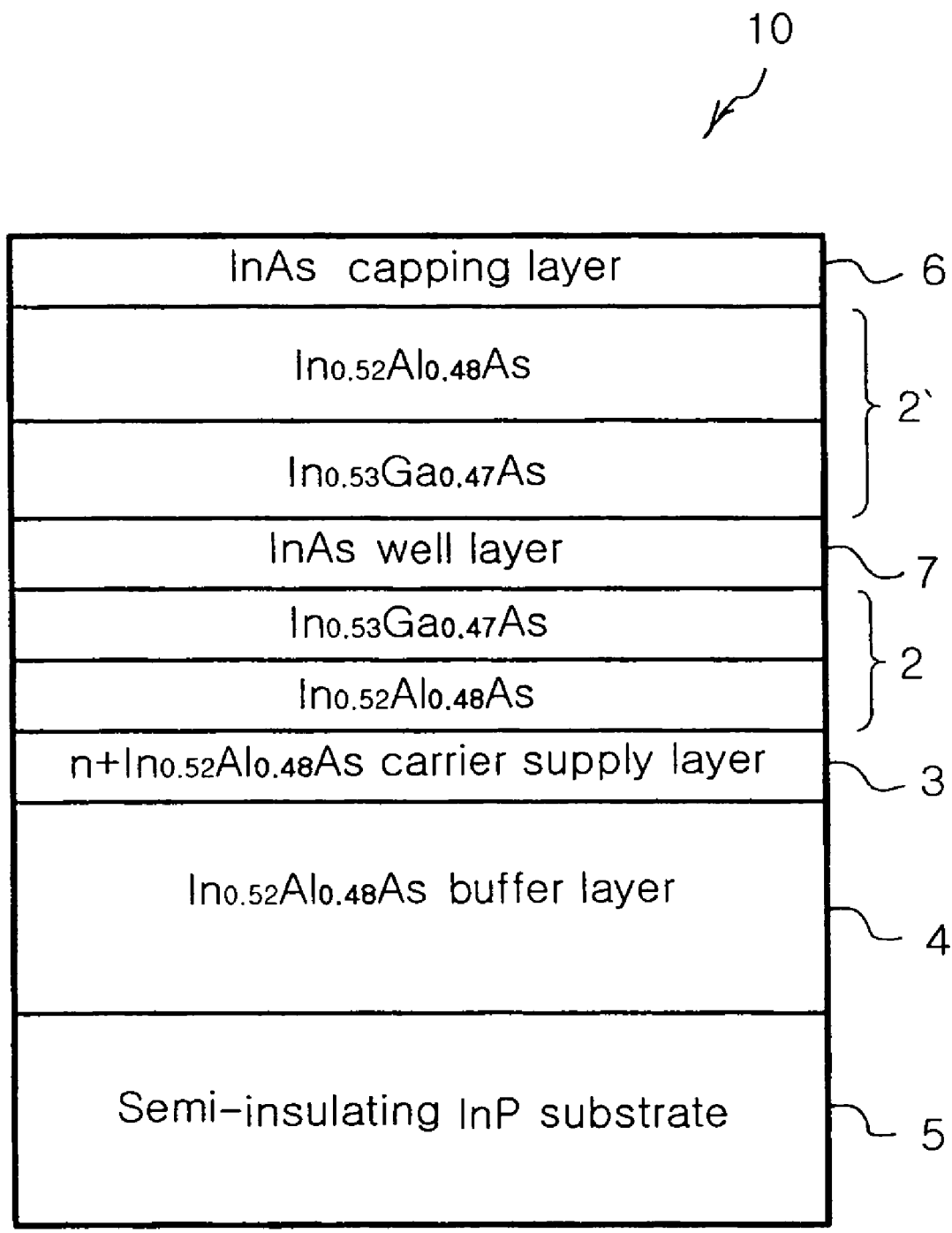
FIG. 2 is a cross-sectional view of a substrate having two-dimensional electron gas structure of a spin transistor according to an embodiment of the present invention.

FIG. 2 is a cross-sectional view of a substrate of a spin transistor according to an embodiment of the present invention.

As shown in FIG. 2, the substrate 10 includes an semi-insulating InP substrate 5, an InAlAs buffer layer 4, an n+InAlAs charge supply layer 3, an InAlAs/InGaAs lower clad layer 2, an InAs quantum well layer 7, an InGaAs/InAlAs upper clad layer 2' and an InAs capping layer 6 which are stacked in order. The substrate 10 has a 2-D electron gas structure. That is, electrons are confined in the InAs layer 7 by the lower clad layer 2 and the upper clad layer 2' so that the InAs layer 7 forms a quantum well. Since the quantum well has two-dimensional electron gas (2-DEG), the electron mobility is very high in the InAs quantum well layer 7 and a spin-orbit coupling effect is greatly occurred. The quantum well layer 7 acts as a channel of the spin transistor.

The buffer layer 4 is formed to compensate a lattice mismatch between the InP substrate 5 and the 2-D electron gas structure grown thereon. The InAs capping layer 6 prevents the substrate 10 from being oxidized or transformed while fabricating process.

In the present embodiment, the quantum well layer 7 is formed of InAs. However, the present invention is not limited thereby. For example, the quantum well layer 7 may be formed of GaAs, InAs or InGaAs in order to form the channel of the spin transistor 50.

Hereinafter, a method of fabricating a spin transistor according to an embodiment of the present invention will be described with reference to FIGS. 3A through 3E.

Figure 3A:
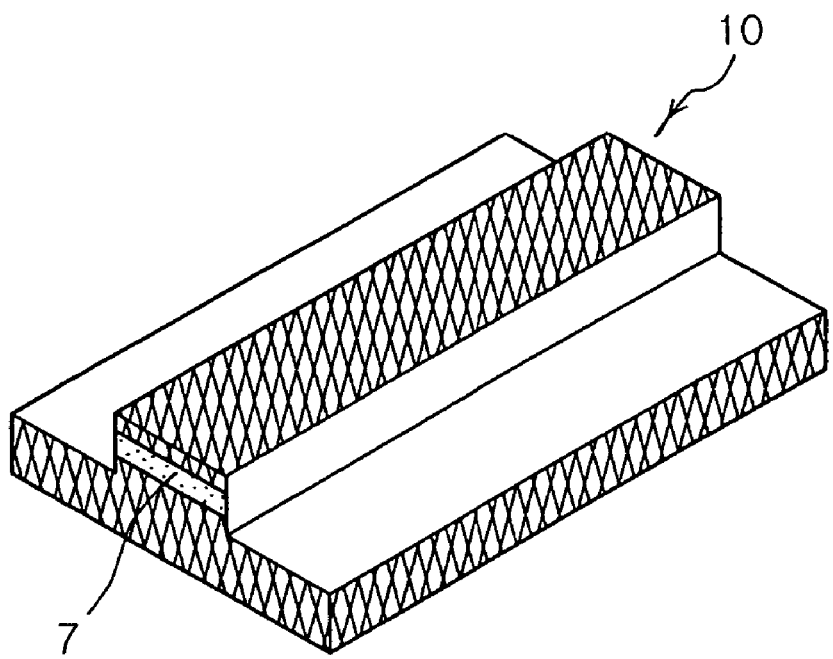
FIGS. 3A through 3E are schematic views for describing a method of fabricating a spin transistor according to an embodiment of the present invention.

Referring to FIG. 3A, after forming the stack structure as shown in FIG. 2, the substrate 10 having a ridge structure is formed by removing predetermined portions from both sides of the stack structure through a lithography process and an ion-milling process. As a result, the channel of the quantum well layer 7 is defined by the ridge structure. It is preferable to form the quantum well layer 7 to have a width of about 100 to 800 nm.

Figure 3B:
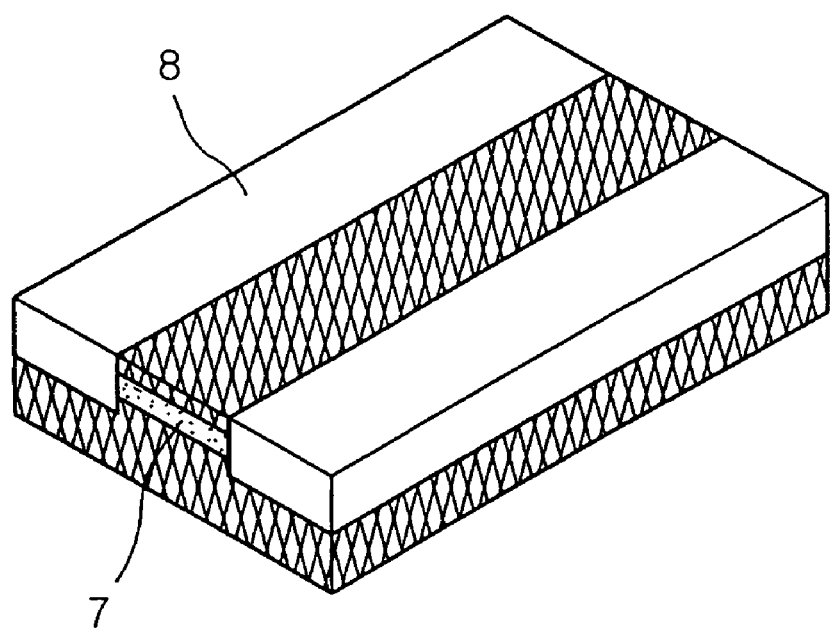

As shown in FIG. 3B, an insulating layer 8 is deposited on the both side portion of the ridge structure for planarization. For example, the insulating layer 8 may be formed of $TaO_2$ or $SiO_2$. The insulating layer 8 insulates the channel from an adjacent channel.

Figure 3C:
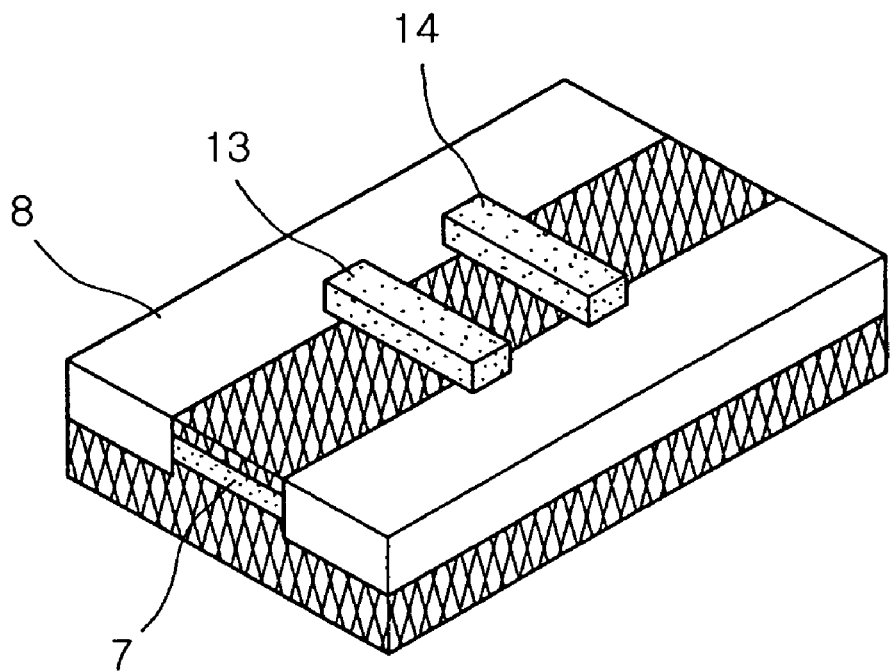

As shown in FIG. 3C, a ferromagnetic material is deposited on the quantum well 7 through an electric beam lithography process and a sputtering process to form the source 13 and the drain 14. The source 13 or the drain 14 may be made of ferromagnetic metal which is one selected from the group consisting of Fe, Co, Ni, CoFe, NiFe, and combination thereof. Also, the source 13 or the drain 14 may be made of ferromagnetic semiconductor such as (Ga, Mn)As.

Figure 3D:
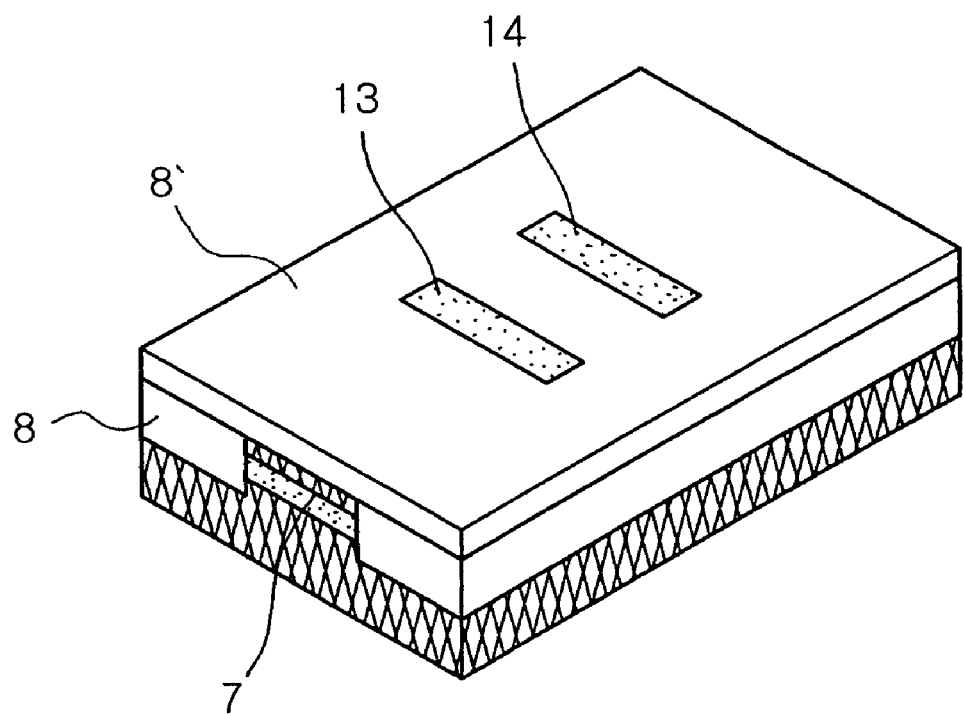

As described above, the source 13 and the drain 14 are disposed to have the magnetization direction that is perpendicular to the channel length direction. Accordingly, the spin-orbit coupling induced magnetic field generated by Rashba effect is parallel or anti-parallel to the magnetization direction of the source 13 and the drain 14. Preferably, the source 13 and the drain 14 are formed of the ferromagnetic material to have about 60 nm of thickness and to have a proper shape and size for satisfying a single domain such as 200 nm by 800 nm rectangle. After forming the source 13 and the drain 14, another insulating layer 8' is deposited on the insulating layer 8 as shown in FIG. 3D to obtain a planarized structure.

Figure 3E:
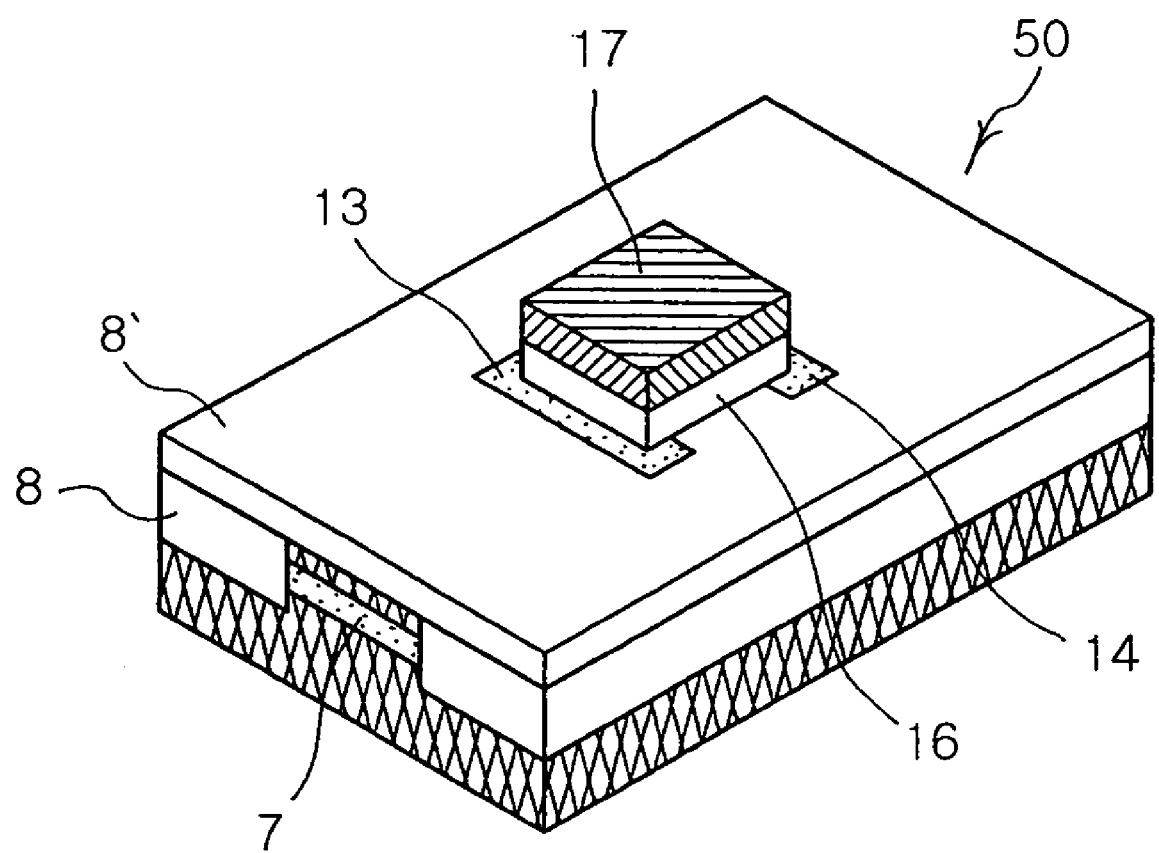

As shown in FIG. 3E, the gate insulting layer 16 is formed on the above structure with an oxide layer, and the gate 17 made of Al or Au is formed on the gate insulating layer 16. As a result, the spin transistor 50 according to the present embodiment is obtained.

Hereinafter, operations of the spin transistor according to the present invention will be described with reference to FIGS. 4A through 5B. If there exists electric field (E) perpendicular to a wave vector κ of an electron passing the channel in the quantum well layer, a magnetic field ($H_{eff} \propto \kappa \times E$) is induced by the spin-orbit coupling. It is called as the Rashba effect. Herein, if the electrons travel in the X direction along the channel and electric field is formed in the Z direction by the gate voltage, the spin-orbit coupling induced magnetic field is generated with the Y direction. The spin transistor according to the present invention controls the spin direction of the electron passing the channel using the spin-orbit coupling induced magnetic field, and the spin transistor performs ON/OFF operations in response thereto. According to the present invention, two methods of operating the spin transistor can be provided. One method of operating the spin transistor according to a first embodiment is shown in FIGS. 4A and 4B, and the other method of operating the spin transistor according to a second embodiment is shown in FIGS. 5A and 5B.

Figure 4A:
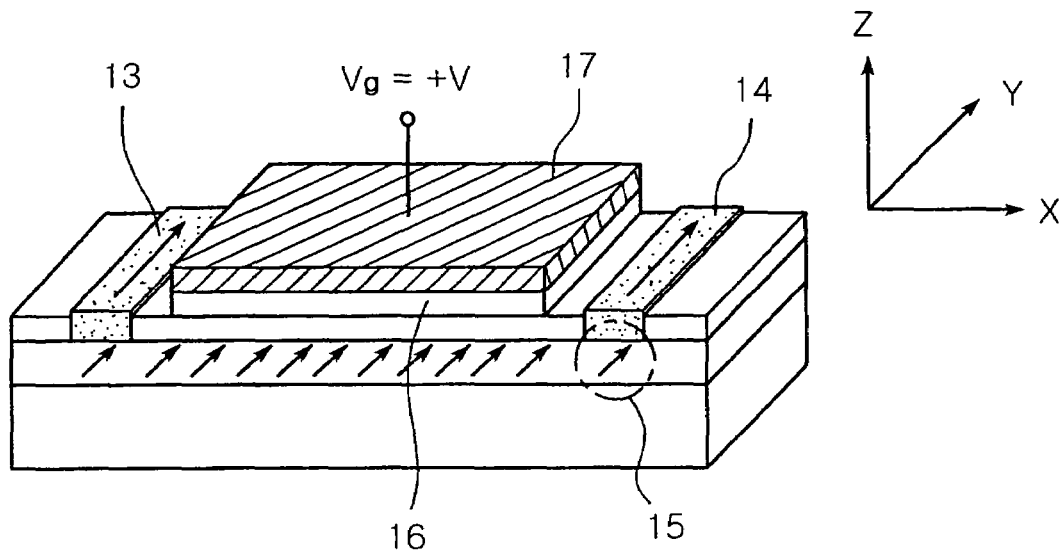
FIGS. 4A and 4B are views for explaining switching operations of a spin transistor according to an embodiment of the present invention.
Figure 4B:
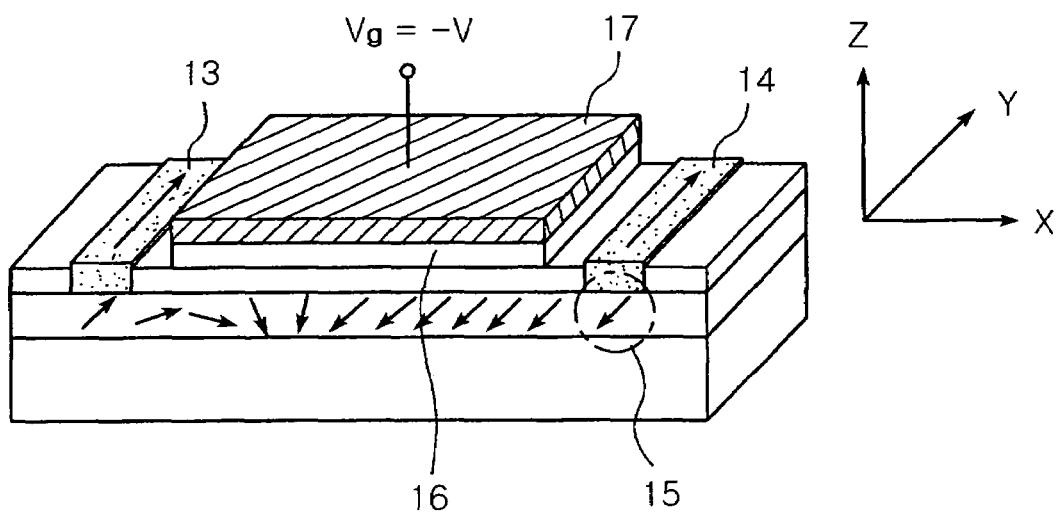
Figure 5A:
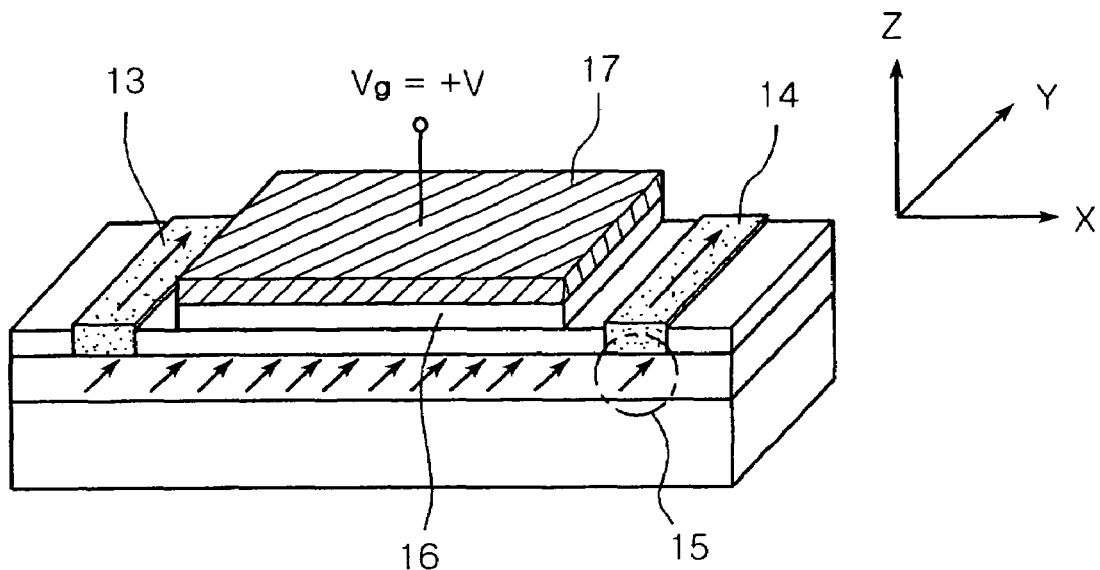
FIGS. 5A and 5B are views for explaining switching operations of a spin transistor according to another embodiment of the present invention.
Figure 5B:
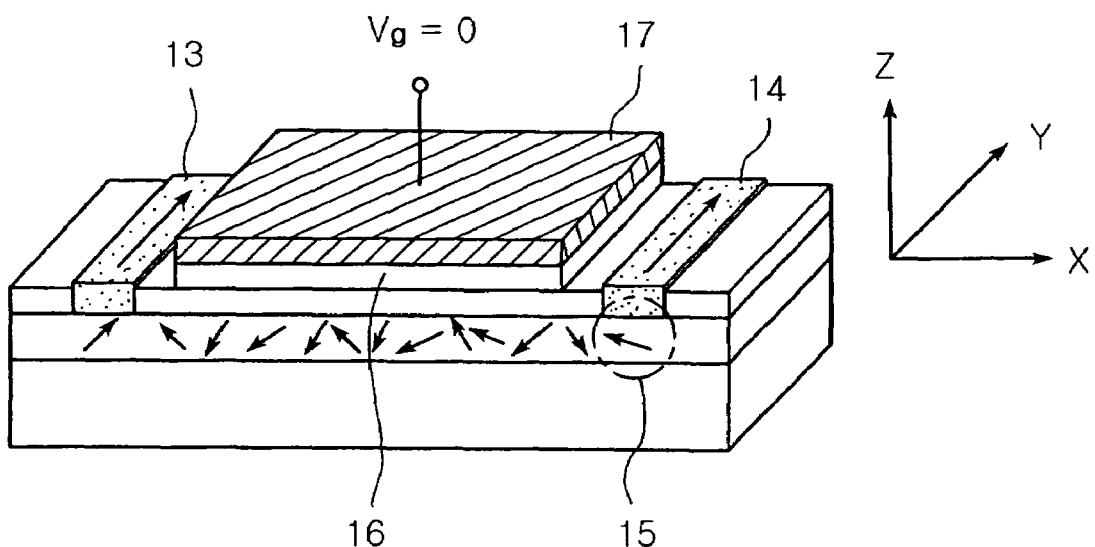

Referring to FIGS. 4A and 4B, in the operating method according to the first embodiment, the spin direction of the electron is controlled to be parallel or anti-parallel to the magnetization direction of a source and a drain by controlling a polarity (+ or −) of the gate voltage ($V_g$).

As shown in FIG. 4A, if the positive voltage (+V) is applied to the gate 17, the spin-orbit coupling induced magnetic field is generated to have an identical direction Y to the magnetization direction Y of the source 13 and the drain 14. The magnetization direction of the source 13 and the drain 14 is perpendicular to the length direction X of the channel as described above. Therefore, a spin polarized electron injected from the source 13 maintains the spin information while passing the channel. When the electron reaches a destination point 15 of the drain 14, low resistance is formed because the spin direction of the electron at the point 15 is parallel to the magnetization direction of the drain 14. Such a low resistance allows the spin transistor to be in ON-state.

On the contrary, if the negative voltage (−V) is applied to the gate 17 as shown in FIG. 4B, the spin-orbit coupling induced magnetic field is generated with a direction −Y opposite to the magnetization direction Y of the source 13 and the drain 14. Accordingly, the spin-polarized electron injected from the source 13 is influenced by the generated spin-orbit coupling induced magnetic field and thus, the spin direction of the electron is reversed while passing the channel. As a result, when the electron reaches the destination point 15 of the drain 14, the spin direction of the electron is changed to be anti-parallel to the magnetization direction Y of the drain 14, and high resistance is formed. Therefore, the spin transistor is turned off, that is, OFF-state.

As described above, the spin precession of the electron is not occurred in the spin transistor according to the present invention. Therefore, there is no need to control the angle of the spin precession and the channel length for ON/OFF operations. Furthermore, the spin transistor has a wide ON/OFF operation margin and allows a wide fabrication margin for the channel length because the spin-orbit coupling induced magnetic field is used to control the electron spin direction to be parallel or anti-parallel to the magnetization direction of the source 13 and the drain 14. Therefore, the spin transistor according to the present invention provides high operation reliability and allows a simplified fabricating process thereof.

FIGS. 5A amd 5B show a method of operating a spin transistor according to a second embodiment of the present invention. As shown in FIG. 5A, a turn-on operation according to the second embodiment is identical to that of the first embodiment shown in FIG. 4A. That is, in ON-state the gate voltage is applied to generate the spin-orbit coupling induced magnetic field with the direction so that the spin information of the electron injected from the source 13 is maintained during ON-state. In order to turn-off the spin transistor, 0 V is applied to the gate 17, that is, the gate voltage is removed. Accordingly, the electrons have random directions while the electrons pass the channel. Especially, the channel is made to be longer than a spin diffusion distance when 0V is applied to the gate 17 in order to loss the spin information of the electron while traveling the channel. Therefore, the spin direction of the electron and the magnetization direction of the drain 14 form a considerable angle when the electron reaches the destination point 15 of the drain 14. As a result, comparatively higher resistance is formed than in the ON-state shown in FIG. 5A, and thus the spin transistor is turned-Off, that is, in OFF-state. The operating method according to the second embodiment is very effective when the electron spin is difficult to reverse due to the structural characteristics of the channel material even though the direction of the spin-orbit coupling induced magnetic field is changed from parallel to anti-parallel.

Figure 6:
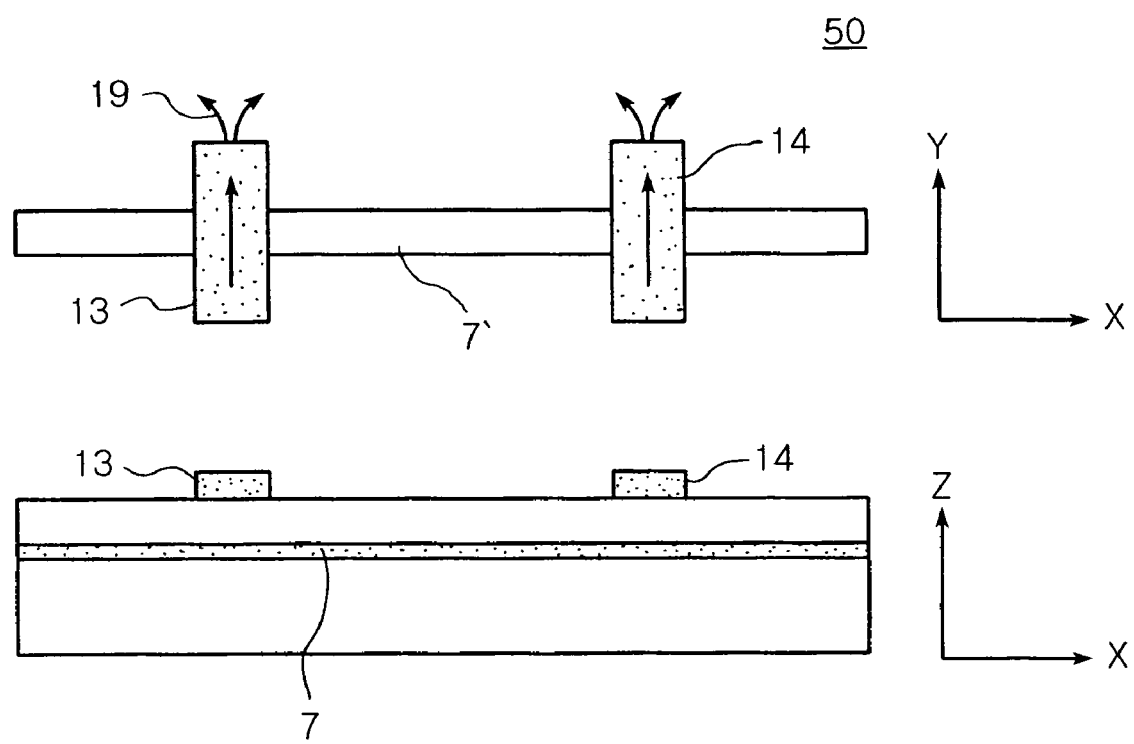
FIG. 6 is schematic top view and cross-sectional view for explaining a leakage magnetic field of a spin transistor according to the present invention.

The spin transistor according to the present invention is less influenced by the leakage magnetic field generated at the ends of the source 13 and the drain 14 compared to the conventional spin transistor. Such an advantageous characteristic of the present invention is well shown in FIGS. 6 and 7. FIG. 6 schematically shows influence of leakage magnetic field in a spin transistor according to the present invention, and FIG. 7 schematically shows influence of leakage magnetic field in the conventional spin transistor.

Referring to FIG. 6, each of the source 13 and the drain 14 forms magnetization of a length direction thereof which is an easy axis of shape anisotropy. As described above, such magnetization directions of the source 13 and the drain 14 are identical each other and are perpendicular to the length direction of the channel 7. Therefore, the electron is hardly influenced by the leakage magnetic field 19 leaked from the ends of the source 13 and the drain 14 while the electron travels the channel. Therefore, the spin transistor according to the present invention produces less noise.

Figure 7:
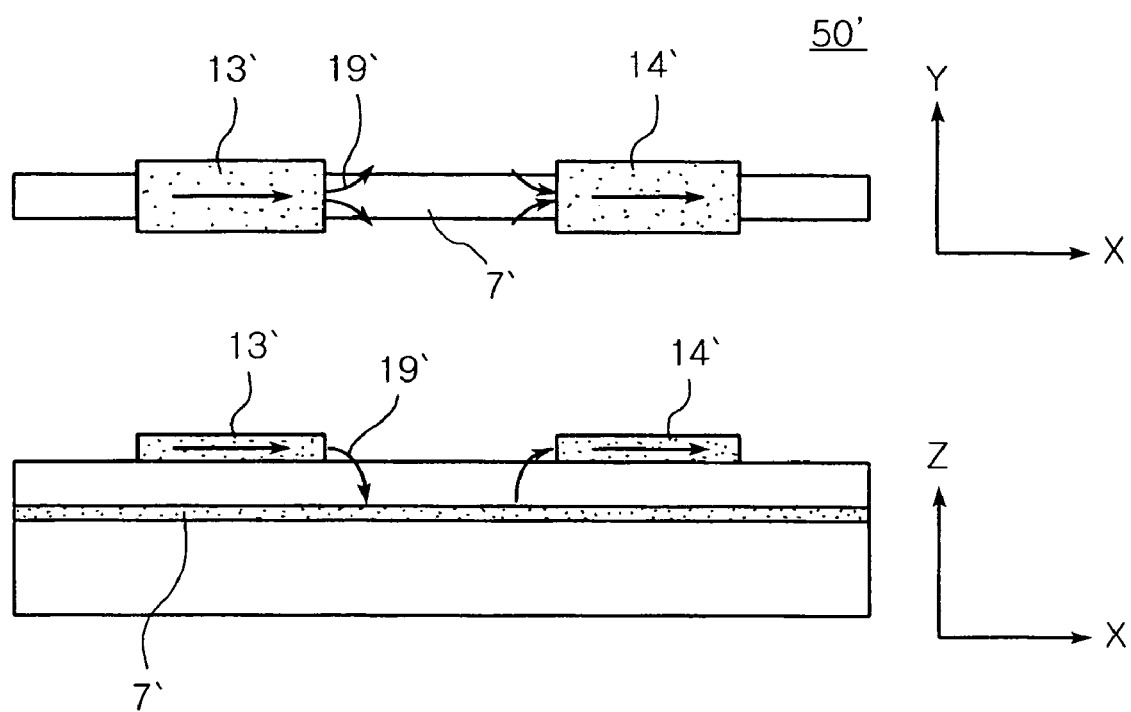
FIG. 7 is schematic top view and cross-sectional view for explaining a leakage magnetic field of a conventional spin transistor.

In a conventional spin transistor 50', magnetization directions of a source 13' and a drain 14' are arranged to be parallel to a channel 7' which is a quantum well layer, as shown in FIG. 7. Accordingly, the electron is greatly influenced by the leakage magnetic field 19' leaked from the ends of the source 13' and the drain 14' while the electron travels the channel 7. Therefore, the conventional spin transistor 50' produces greater noise by the leakage magnetic field. As a result, the operation reliability of the conventional spin transistor 50' degrades.

As described above, the spin transistor according to the present invention provides a broad ON/OFF operation margin and allows a wide process margin for the channel length by forming the source and the drain to have the magnetization direction perpendicular to the length direction of the channel. Accordingly, the operation reliability of the spin transistor is improved and the fabrication process thereof is simplified. Also, the spin transistor according to the present invention produces less noise because the traveling electron is hardly influenced by the leakage magnetic field generated at the ends of the source and the drain.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A spin transistor comprising: a substrate having a channel;
a source and a drain, which are made of ferromagnetic material, formed on the substrate to be separated from each other and having identical magnetization directions during all device operations in two distinct states, high resistance and low resistance; a gate formed on the substrate for controlling a spin direction of an electron passing through the channel, wherein the magnetization directions of the source and the drain are perpendicular to a length direction of the channel, and the spin direction of the electron passing through the channel is controlled by using a spin-orbit coupling induced magnetic field.

2. The spin transistor of claim 1, wherein the channel is formed as a quantum well layer.

3. The spin transistor of claim 2, wherein the quantum well layer is formed of one selected from the group consisting of GaAs, InAs and InGaAs.

4. The spin transistor of claim 1, wherein at least one of the source and the drain is made of a ferromagnetic metal.

5. The spin transistor of claim 4, wherein the ferromagnetic metal is one selected from the group consisting of Fe, Co, Ni, CoFe, NiFe, and combination thereof.

6. The spin transistor of claim 1, wherein at least one of the source and the drain is made of a ferromagnetic semiconductor.

7. The spin transistor of claim 6 wherein the ferromagnetic semiconductor is (Ga, Mn)As.

8. The spin transistor of claim 1, wherein the substrate includes an InAs quantum well layer interposed between an undoped upper clad layer and an undoped lower clad layer.

9. The spin transistor of claim 8, wherein each of the upper and lower clad layers has a double layer structure formed of an InGaAs layer and an InAlAs layer.

10. The spin transistor of claim 8, wherein the substrate further includes an InAlAs carrier supply layer formed under the lower clad layer.

11. The spin transistor of claim 8, wherein the substrate further includes an InAs capping layer formed on the upper clad layer.

12. The spin transistor of claim 1, wherein the substrate has a ridge structure with both sides being removed and the channel is defined by the ridge structure.

13. The spin transistor of claim 12, wherein an insulating layer is formed on the both side of the ridge structure for planarization.

14. The spin transistor of claim 13, wherein the insulating layer is formed of $SiO_2$ or $TaO_2$.

15. The spin transistor of claim 1, wherein the spin direction of the electron is controlled to be parallel or anti-parallel to the magnetization direction of the source and the drain using the spin-orbit coupling induced magnetic field through controlling a polarity of the gate voltage in order to control ON/OFF operations.

16. The spin transistor of claim 15, wherein the spin transistor is turned on when the direction of the spin-orbit coupling induced magnetic field is identical to the spin direction of the electron injected from the source; and the spin transistor is turned off when the direction of the spin-orbit coupling induced magnetic field is opposite to the spin direction of the electron injected from the source.

17. The spin transistor of claim 1, wherein the gate voltage is removed during OFF-state so that the electron has a random spin direction, and the gate voltage is applied during ON-state so that the electron has a spin direction to maintain spin information of the electron injected from the source.

* * * * *